United States Patent
Chang

[11] Patent Number: 5,913,142
[45] Date of Patent: Jun. 15, 1999

[54] METHOD OF IMPROVING THE PLANARIZATON OF AN INTER-METAL DIELECTRIC LAYER

[75] Inventor: Ming-Lun Chang, Hsinchu, Taiwan

[73] Assignee: Winbond Electronics Corp., Taiwan

[21] Appl. No.: 08/933,931

[22] Filed: Sep. 19, 1997

[30] Foreign Application Priority Data

Jul. 22, 1997 [TW] Taiwan ................................. 86110389

[51] Int. Cl.⁶ ............................................... H01L 21/4763
[52] U.S. Cl. ............................ 438/626; 438/627; 438/631; 438/636; 438/637; 438/645; 438/672; 438/675
[58] Field of Search .................................. 438/626, 627, 438/631, 636, 637, 645, 672, 675

[56] References Cited

U.S. PATENT DOCUMENTS

| | | | |
|---|---|---|---|
| 5,563,099 | 10/1996 | Grass ........................................ | 438/632 |
| 5,747,382 | 5/1998 | Huang et al. ............................ | 438/624 |
| 5,789,315 | 8/1998 | Besser et al. ............................ | 438/624 |
| 5,854,503 | 11/1998 | Hsuch et al. ............................ | 257/347 |

*Primary Examiner*—John F. Niebling
*Assistant Examiner*—David A. Zarneke
*Attorney, Agent, or Firm*—Rabin & Champagne, P.C.

[57] ABSTRACT

A method of planarizing an inter-metal dielectric layer includes providing a semiconductor substrate having a component layer formed thereon; and forming a metallic layer over the component layer. Then, portions of the metallic layer are etched to form metal pads on the metallic layer surface. Next, the metallic layer is patterned and portions of the metallic layer are etched to form a plurality of metal lines and trenches between the metal lines. Subsequently, a first oxide layer is deposited over the metal lines and the trenches, and then a spin on glass layer is formed over the first oxide layer, filling up the trenches. Thereafter, portions of the spin on glass layer are etched back to expose the metal pad and form a residual spin on glass layer, and then a second oxide layer is formed over the metal pad, the residual spin on glass layer and the first oxide layer. Portions of the second oxide layer are etched to form an opening in the second oxide layer that corresponds to the metal pad location. The opening is subsequently used to form a via plug.

16 Claims, 3 Drawing Sheets

METHOD OF IMPROVING THE PLANARIZATON OF AN INTER-METAL DIELECTRIC LAYER

BACKGROUND OF THE INVENTION

1. Field of Invention

The present invention relates to a method of planarizing inter-metal dielectric (IMD) layers, and more particularly to a method of improving the planarization of an inter-metal dielectric layer using spin on glass (SOG) such that the formation of poisoned vias is prevented.

2. Description of Related Art

To match the ever increasing complexity and precision requirements of semiconductor integrated circuits, two or more metal interconnect layers formed above a wafer chip are quite common in semiconductor manufacturing. This is especially true in the manufacturing of logic circuit products. When components are further miniaturized and more stringent design rules are applied, new techniques for forming interconnects that go together with the planarization of dielectric layers are always in demand. At present, a contact plug is used for connecting one terminal of a MOS component with a metallic layer, and a via plug is used for interconnecting two different metallic layers. Two main plugging techniques now employed by most VLSI circuit manufacturers include the tungsten plug and the high temperature aluminum plug.

A spin on glass method is a commonly used planarization technique for planarizing inter-metal dielectric layers. One advantage of using spin on glass is its characteristic fluidity. Awkward surface structures such as trenches between one metallic line and the next that normally defy proper coverage using a conventional planarization technique can be easily filled by a spin on glass layer. Therefore, the spin on glass layer has a better step coverage capability. However, when the spin on glass layer is subsequently removed by etching, not all of the unwanted spin on glass layer can be removed. Some of the spin on glass may still remain as a residue above the metal lines, especially surrounding the metal via areas. In subsequent steps, if low pressure and high temperature processes are performed, for example, metal sputtering, plasma enhanced chemical vapor deposition (PECVD) or high temperature deposition of aluminum, residual solvent and moisture in the residual spin on glass may be driven out causing the so-called poisoned via phenomenon. These poisoned vias can lead to a number of defects. For example, the out diffusion of the solvent and moisture may lead to a volumetric expansion of the metal vias, or the solvent and moisture may react with the metal leading to a higher component resistance, or may simply cause an open circuit in the metal vias. In light of the foregoing, there is a need in the art for an improved method of planarizing the inter-metal dielectric layer using spin on glass.

SUMMARY OF THE INVENTION

Accordingly, the present invention is directed to providing a method of planarizing an inter-metal dielectric layer that can substantially eliminate spin on glass within the metal via area, thereby avoiding the defects caused by the formation of a poisoned via.

To achieve these and other advantages and in accordance with the purpose of the invention, as embodied and broadly described herein, the invention includes a method of planarizing an inter-metal dielectric layer comprising providing a semiconductor substrate having a component layer formed thereon; and forming a metallic layer over the component layer. Then, portions of the metallic layer are etched to form metal pads on the metallic layer surface. Next, the metallic layer is patterned and portions of the metallic layer are etched to form a plurality of metal lines and trenches between the metal lines. Subsequently, a first oxide layer is deposited over the metal lines and the trenches, and then a spin on glass layer is formed over the first oxide layer filling up the trenches. Thereafter, portions of the spin on glass layer are etched back, exposing the metal pad and leaving a residual spin on glass layer behind, and then a second oxide layer is formed over the metal pad, the residual spin on glass layer and the first oxide layer. Finally, portions of the second oxide layer are etched to form an opening in the second oxide layer that corresponds to the metal pad location. The opening is subsequently used to form a via plug.

It is to be understood that both the foregoing general description and the following detailed description are exemplary, and are intended to provide a further explanation of the invention as claimed.

BRIEF DESCRIPTION OF THE DRAWINGS

The accompanying drawings are included to provide a further understanding of the invention and are incorporated in and constitute a part of this specification. The drawings illustrate an embodiment of the invention and, together with the description, serve to explain the principles of the invention. In the drawings.

DESCRIPTION OF THE PREFERRED EMBODIMENT

Figure 1:
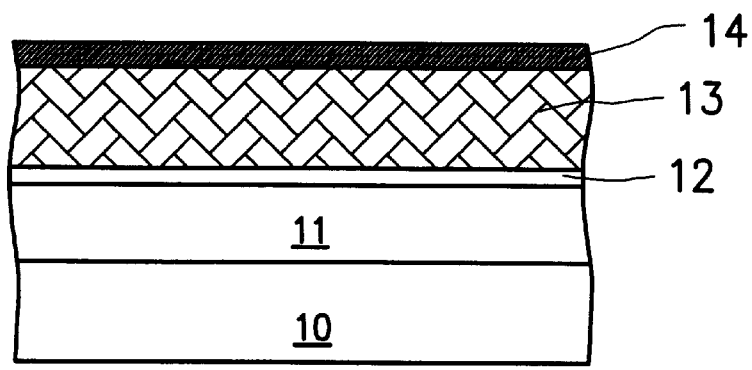
FIGS. 1 through 7 are cross-sectional views showing the progression of steps in the planarization of an inter-metal dielectric layer according to one preferred embodiment of the invention.

Reference will now be made in detail to the present preferred embodiment of the invention, an example of which is illustrated in the accompanying drawings. Wherever possible, the same reference numbers are used in the drawings and the description to refer to the same or like parts.

In accordance with the invention, there is provided a method of improving the planarization of an inter-metal dielectric layer. The method is capable of eliminating substantially all the spin on glass within the via area, thereby avoiding the defects due to the formation of poisoned vias.

FIGS. 1 through 7 are cross-sectional views showing the progression of steps in the planarization of an inter-metal dielectric layer according to one preferred embodiment of the invention. First, as shown in FIG. 1, a semiconductor substrate 10 having a component layer 11 formed thereon is provided. The component layer 11 can comprise one or more transistor components, or can comprise multiple metallic layers. Then, a barrier layer 12 is formed over the component layer 11. For example, the barrier layer 12 can be a titanium/titanium nitride layer (Ti/TiN). Subsequently, a metallic layer 13 is formed over the barrier layer 12. The metallic layer 13 has a thickness greater than a target thickness of a metal line by about 1000 Å to 2000 Å. Thereafter, an anti-refractive coating (ARC) 14 is formed over the metallic layer 13. For example, the anti-refractive coating 14 can be a titanium nitride layer (TiN).

Figure 2:
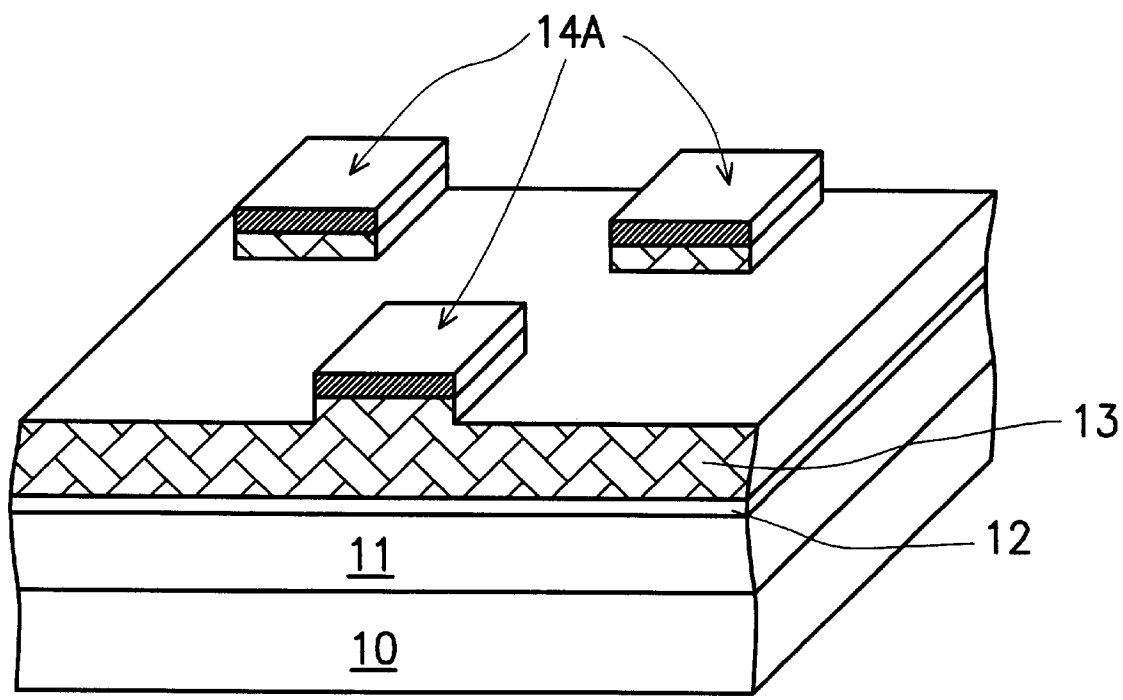

Next, in FIG. 2, using a photomask, a photolithographic process is performed, and then portions of the anti-refractive coating 14 and portions of the metallic layer 13 are etched to form a multiple of metal pads 14a each having a thickness of about 1000 Å to 2000 Å. The photomask used in the above process is complementary to a photomask used in the subsequent formation of a via and has a reverse tone. The metal pads 14a are positioned at locations that correspond to the desired via plugs. Furthermore, the dimensions of the metal pads 14a are somewhat larger than the dimensions of the via plugs, for example, larger by about 0.1 µm to 0.2 µm on each side, to minimize photolithographic processing errors when the via plugs are subsequently formed.

Figure 3:
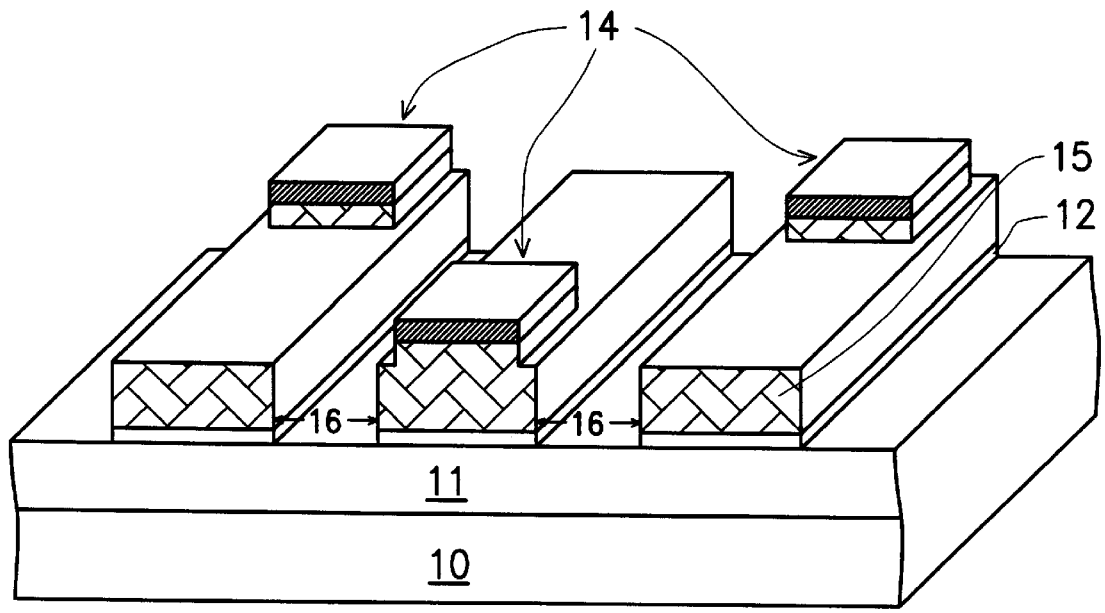

Next, in FIG. 3, a photolithographic process is performed to form a pattern on the metallic layer 13. Then, portions of the metallic layer 13 and the barrier layer 12 are etched to expose portions of the component layer 11, thereby forming a plurality of metal lines 15 and a plurality of trenches 16 between the metal lines 15.

Figure 4:
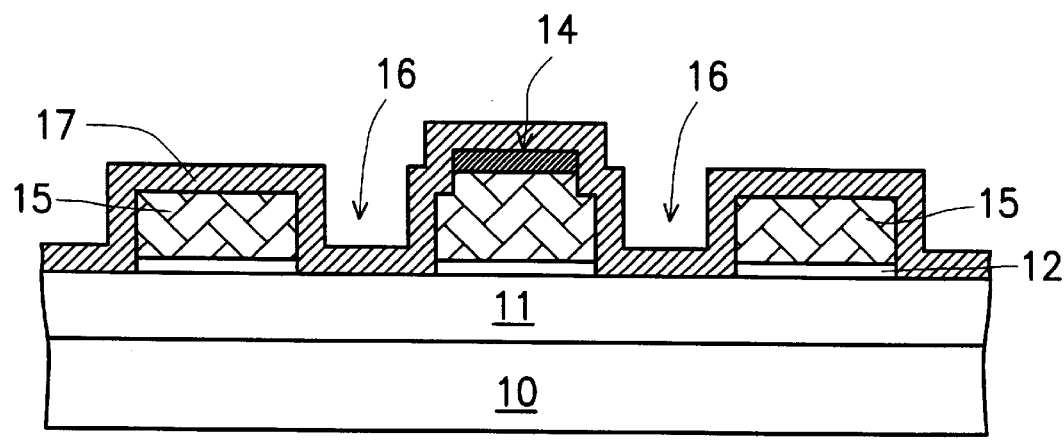

Next, in FIG. 4, a first oxide layer 17 is deposited over the trenches 16 and the metal lines 15. The first oxide layer 17 can be formed, for example, by using a plasma enhanced chemical vapor deposition (PECVD) method to deposit an oxide layer having a thickness of about 1500 Å to 2500 Å.

Figure 5:
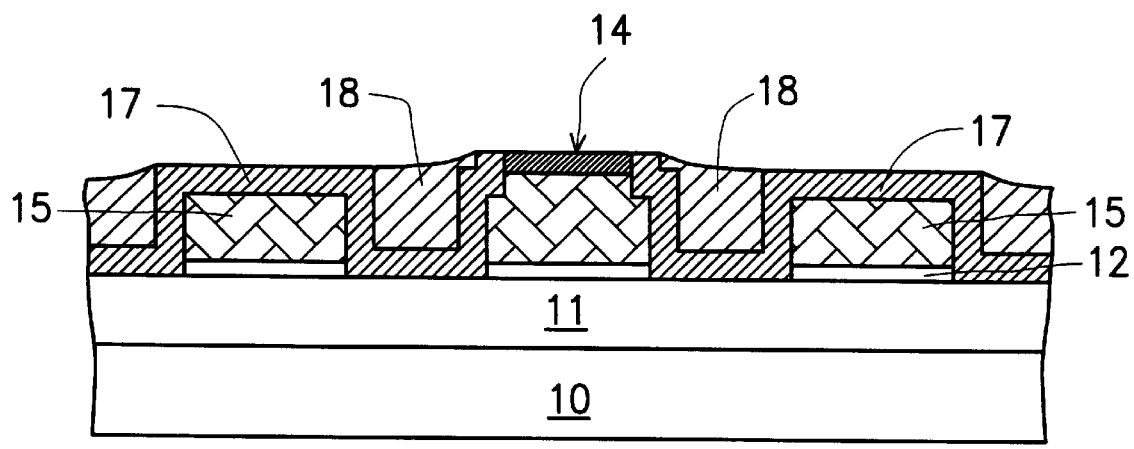

Next, in FIG. 5, a spin on glass (SOG) layer 18 is formed over the first oxide layer 17, thus filling up the trenches 16. The spin on glass layer 18 can be formed by a double coating method. In other words, a first spin on glass layer having a thickness of about 1500 Å to 3000 521 is first coated, and then cured; then, a second spin on glass layer having a thickness again of about 1500 Å to 3000 Å is coated on top of the first spin on glass layer, and then cured. Therefore, the spin on glass layer 18 can have a total thickness of about 2500 Å to 5000 Å. Thereafter, portions of the spin on glass layer 18 are etched back to expose the metal pad 14a, thus forming a residual spin on glass layer. Because the height for the areas in a region of the metal pads is somewhat higher than those areas where there are no metal pads, the spin on glass layer 18 above the metal pads 14a tends to be completely removed. Therefore, no residual spin on glass layer will remain atop the metal pads 14a to harm subsequent processes.

Figure 6:
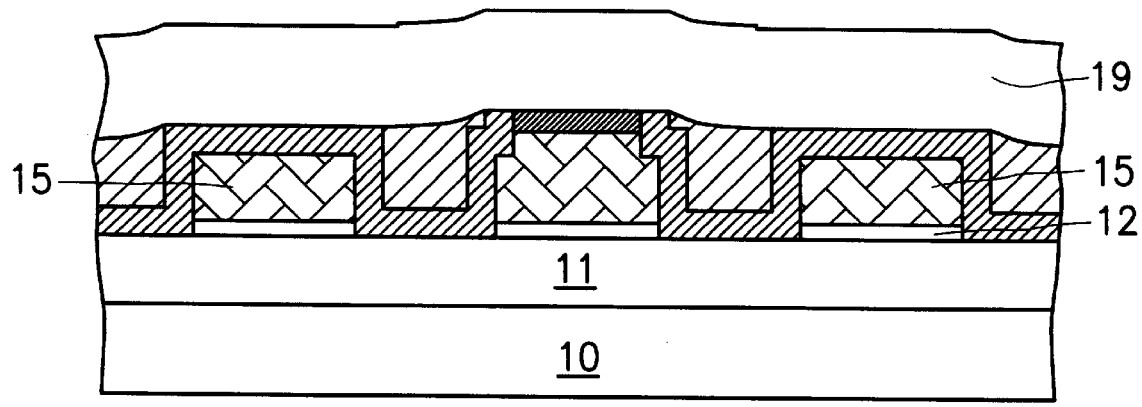

Next, as shown in FIG. 6, a second oxide layer 19 is deposited over the metal pads 14a and the residual spin on glass layer. The second oxide layer 19 can be formed, for example, by using a plasma enhanced chemical vapor deposition (PECVD) method to deposit an oxide layer having a thickness of about 4000 Å to 6000 Å.

Figure 7:
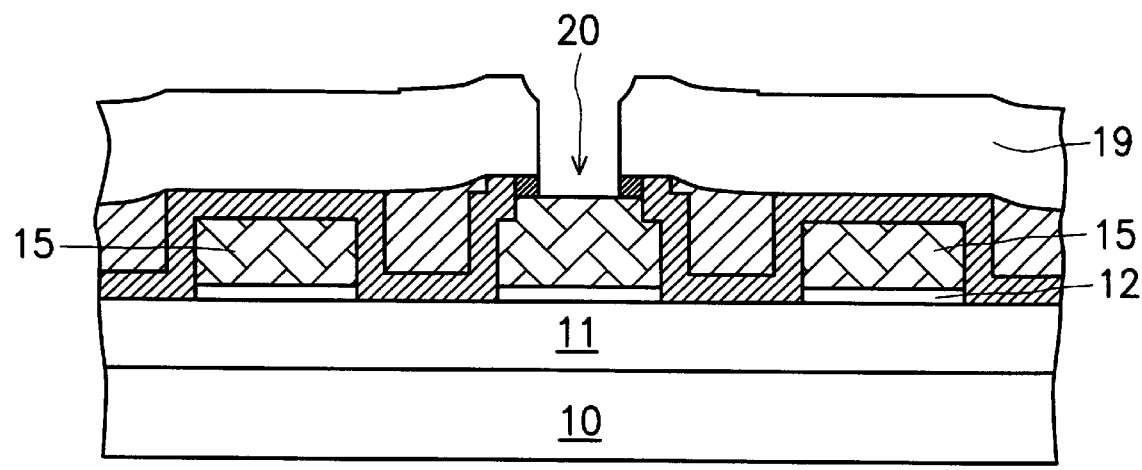

Finally, as shown in FIG. 7, a pattern is formed on the second oxide layer 19 using a photolithographic process. Then, portions of the second oxide layer 19 are etched to form openings 20 above the corresponding metal pads 14a. The openings 20 are subsequently used to form via plugs or contact plugs. The openings 20 can be formed by a method including first performing a wet etching followed by a dry etching.

As a summary, the method for forming plugs according to the present invention has the following advantages:

(1) The metal pads 14a are deliberately made higher than metal lines 15 by about 1000 Å to 2000 Å in the invention. Consequently, when the spin on glass layer 18 is etched back, all the spin on glass layer on top of the metal pads 14a will be completely removed without any residual trace.

(2) Since all the spin on glass layer above the metal pads 14a is completely removed, the final metal vias will be surrounded only by the second oxide layer 19, and there will be no out-diffusion of solvent or moisture. Therefore, any harmful effects on the via caused by the presence of spin on glass will be completely eliminated, making the structure created by the invention capable of avoiding the defective formation of poisoned vias.

It will be apparent to those skilled in the art that various modifications and variations can be made to the present invention without departing from the scope or spirit of the invention. In view of the foregoing, it is intended that the present invention cover modifications and variations provided they fall within the scope of the following claims and their equivalents.

What is claimed is:

1. A method of improving a planarization of an inter-metal dielectric layer, comprising:

providing a semiconductor substrate having a component layer formed thereon;

forming a metallic layer over the component layer;

patterning and etching the metallic layer to form at least one metal pad;

patterning the metallic layer and etching away portions of the metallic layer to form a plurality of metal lines, and a plurality of respective trenches between the metal lines;

depositing a first oxide layer over the metal lines and the trenches;

forming a spin on glass layer over the first oxide layer, and filling up the trenches;

etching back the spin on glass layer to expose the metal pad, and form a residual spin on glass layer; and forming a via hole above the metal pad.

2. The method of claim 1, wherein said providing a semiconductor substrate includes providing the semiconductor substrate with at least one transistor component layer thereon.

3. The method of claim 1, wherein said providing a semiconductor substrate includes providing the semiconductor substrate with at least one metallic component layer thereon.

4. The method of claim 1, further comprising depositing a barrier layer over the component layer before said forming a metallic layer.

5. The method of claim 4, wherein said depositing a barrier layer includes forming a titanium/titanium nitride barrier layer.

6. The method of claim 1, wherein said forming a metallic layer further includes coating an anti-refraction titanium nitride layer over the metallic layer.

7. The method of claim 1, wherein said forming the metallic layer includes forming the metallic layer to a thickness greater than a target thickness of the metal lines.

8. The method of claim 1, wherein said patterning and etching includes forming the metal pad in a location corresponding to a desired plug hole position.

9. The method of claim 1, wherein said patterning and etching includes forming the metal pad to a thickness of about 1000 Å to about 2000 Å.

10. The method of claim 1, wherein said depositing a first oxide layer includes using plasma enhanced chemical vapor deposition to deposit an oxide layer to a thickness of about 1500 Å to about 2500 Å.

11. The method of claim 1, wherein said forming a spin on glass layer includes coating the first oxide layer with a first spin on glass layer having a thickness of about 1500 Å to about 3000 Å, then curing the first spin on glass layer, thereafter, coating the first spin on glass layer with a second spin on glass layer having a thickness of about 1500 Å to about 3000 Å, and then curing the second spin on glass layer.

12. The method of claim 1, wherein said etching back the spin on glass layer includes completely removing the spin on glass layer above the metal pad.

13. A method of improving a planarization of an inter-metal dielectric layer, comprising:

provic a semiconductor substrate having a component layer formed thereon;

forming a barrier layer over the component layer;

forming a metallic layer over the barrier layer;

patterning the metallic layer, and then etching away portions of the metallic layer to form at least one metal pad;

patterning the metallic layer, and etching away portions of the metallic layer and the barrier layer to expose the component layer, thus forming a plurality of metal lines, and a plurality of respective trenches between the metal lines;

depositing a first oxide layer over the trenches and the metal lines;

forming a spin on glass layer over the first oxide layer, and filling up the trenches;

etching back the spin of glass layer to expose the metal pad, and form a residual spin on glass layer;

depositing a second oxide layer over the metal pad and the residual spin on glass layer; and patterning the second oxide layer and etching away portions of the second oxide layer to form an opening corresponding to a location of the metal pad for a subsequent formation of a via hole.

14. The method of claim 13, wherein said depositing a second oxide layer includes using plasma enhanced chemical vapor deposition to deposit an oxide layer having a thickness of about 4000 Å to about 6000 Å.

15. The method of claim 13, wherein said etching away portions of the second oxide layer includes performing wet etching followed by dry etching.

16. A method of improving a planarization of an inter-metal dielectric layer, comprising:

forming at least one metal pad over a component layer;

forming a plurality of metal lines, and a plurality of respective trenches between the metal lines, with the at least one metal pad being formed on a respective metal line;

forming a spin on glass layer over the metal lines, and filling up the trenches, etching back the spin on glass layer to expose the metal pad, and form a residual spin on glass layer;

forming a further layer above the exposed metal pad; and forming a via hole in the further layer and directly above the metal pad.

* * * * *